(12) United States Patent
Kim et al.

(10) Patent No.: US 12,025,897 B2
(45) Date of Patent: Jul. 2, 2024

(54) LIQUID CRYSTAL DISPLAY DEVICE

(71) Applicant: LG Display Co., Ltd., Seoul (KR)

(72) Inventors: ChangEun Kim, Seoul (KR); JoongHa Lee, Paju-si (KR); WonGyu Jeong, Seoul (KR); Jinuk Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/976,589

(22) Filed: Oct. 28, 2022

(65) Prior Publication Data

US 2023/0213829 A1  Jul. 6, 2023

(30) Foreign Application Priority Data

Dec. 31, 2021  (KR) .................... 10-2021-0194594

(51) Int. Cl.
| | |
|---|---|
| *G02F 1/1368* | (2006.01) |
| *G02F 1/1333* | (2006.01) |
| *G02F 1/1343* | (2006.01) |
| *G02F 1/1362* | (2006.01) |
| *H01L 27/12* | (2006.01) |

(52) U.S. Cl.
CPC ...... *G02F 1/1368* (2013.01); *G02F 1/133357* (2021.01); *G02F 1/133368* (2021.01); *G02F 1/13439* (2013.01); *G02F 1/136227* (2013.01); *H01L 27/1248* (2013.01); *G02F 2201/50* (2013.01); *G02F 2202/16* (2013.01)

(58) Field of Classification Search
None
See application file for complete search history.

(56) References Cited

U.S. PATENT DOCUMENTS

| | | | | |
|---|---|---|---|---|
| 7,651,899 B2* | 1/2010 | Lim | ...................... | H01L 27/124 257/E21.414 |
| 2004/0195574 A1* | 10/2004 | Ahn | ..................... | G02F 1/13458 438/152 |
| 2004/0263752 A1* | 12/2004 | Kim | .................. | G02F 1/134363 349/141 |
| 2005/0110931 A1* | 5/2005 | Yoo | .................. | G02F 1/136286 349/141 |

(Continued)

FOREIGN PATENT DOCUMENTS

KR  10-2006-0131071 A  12/2006

*Primary Examiner* — Ryan Crockett
(74) *Attorney, Agent, or Firm* — Morgan, Lewis & Bockius LLP

(57) ABSTRACT

According to an aspect of the present disclosure, a liquid crystal display device includes a lower substrate including a black matrix and a color filter; an upper substrate disposed to be opposite to the lower substrate; a thin film transistor which on the upper substrate to be opposite to the color filter, and including a gate electrode, an active layer, a source electrode, and a drain electrode; at least one insulting layer disposed on the thin film transistor; a pixel electrode disposed on the insulating layer and electrically connected to the drain electrode; and a common electrode spaced apart from the pixel electrode, and the gate electrode includes a first gate conductive layer including a transparent conductive material, a second gate conductive layer including a first transition metal oxide and a second transition metal oxide, and a third gate conductive layer formed of an opaque conductive layer.

16 Claims, 8 Drawing Sheets

(56) References Cited

U.S. PATENT DOCUMENTS

| | | | |
|---|---|---|---|
| 2006/0283833 A1* | 12/2006 | Lee | G02F 1/136286 |
| | | | 349/139 |
| 2007/0019122 A1* | 1/2007 | Lee | H01L 29/458 |
| | | | 257/E29.147 |
| 2010/0134710 A1* | 6/2010 | Ishitani | G02F 1/1368 |
| | | | 349/106 |
| 2011/0157131 A1* | 6/2011 | Miyake | G09G 3/3655 |
| | | | 345/211 |
| 2018/0217460 A1* | 8/2018 | Hao | G02F 1/134363 |
| 2019/0113790 A1* | 4/2019 | Hakoi | G02F 1/1343 |
| 2020/0310199 A1* | 10/2020 | Asagi | C09K 19/0208 |
| 2021/0405460 A1* | 12/2021 | Zhao | G02F 1/133773 |
| 2022/0367840 A1* | 11/2022 | Lee | H10K 59/12 |

\* cited by examiner

LIQUID CRYSTAL DISPLAY DEVICE

CROSS-REFERENCE TO RELATED APPLICATIONS

This application claims the priority of Korean Patent Application No. 10-2021-0194594 filed on Dec. 31, 2021, in the Korean Intellectual Property Office, the disclosure of which is incorporated herein by reference.

BACKGROUND

Technical Field

The present disclosure relates to a liquid crystal display device, and more particularly, to a liquid crystal display device with an improved reflection luminance.

Discussion of the Related Art

Recently, as it enters an information era, a display field which visually expresses electrical information signals has been rapidly developed and in response to this, various display devices having excellent performances such as thin-thickness, light weight, and low power consumption have been developed. Examples of such a display device include a liquid crystal display (LCD) device and an organic light emitting display (OLED) device.

Among them, the liquid crystal display device is a device in which two substrates with electrodes for generating an electric field are disposed to be opposite to each other and a liquid crystal material is injected between two substrates to configure a liquid crystal panel. The liquid crystal display device displays images by controlling an optical anisotropy and birefringence of liquid crystal molecules by an electric field generated by applying a voltage to two electrodes of the liquid crystal panel.

Most of liquid crystal display devices has a structure in which after bonding a thin film transistor substrate in which a thin film transistor forms a matrix arrangement and a color filter substrate in which a color filter is formed, a liquid crystal layer is interposed therebetween. A pixel area formed on the thin film transistor substrate and a pixel area formed on the color filter substrate are bonded to completely overlap. In order to reduce an error generated during the bonding process, a color filter layer may be formed on the thin film transistor substrate.

Recently, a flip over type liquid crystal device which utilizes the thin film transistor substrate as a viewing surface is actively being developed. However, when the thin film transistor substrate is used as a viewing surface, a reflection luminance is generated at an outer periphery of the panel due to a plurality of metal wiring lines and metal electrodes.

SUMMARY

Accordingly, embodiments of the present disclosure are directed to a liquid crystal display device that substantially obviates one or more of the problems due to limitations and disadvantages of the related art.

An aspect of the present disclosure is to provide a borderless type liquid crystal display device in which a width of a bezel area is minimized.

Another aspect of the present disclosure is to solve recognition of a metal layer by a user and degradation of the reflection luminance due to a high reflectance of the gate electrode, in a flip over type liquid crystal display in which the thin film transistor substrate is utilized as a viewing surface.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a liquid crystal display device comprises a lower substrate including a black matrix and a color filter; an upper substrate disposed to be opposite to the lower substrate; a thin film transistor disposed on the upper substrate to be opposite to the color filter, and including a gate electrode, an active layer, a source electrode, and a drain electrode; at least one insulting layer disposed on the thin film transistor; a pixel electrode disposed on the insulating layer and electrically connected to the drain electrode; and a common electrode spaced apart from the pixel electrode, and the gate electrode includes a first gate conductive layer including a transparent conductive material, a second gate conductive layer including a first transition metal oxide and a second transition metal oxide, and a third gate conductive layer formed of an opaque conductive layer.

Other detailed matters of the exemplary embodiments are included in the detailed description and the drawings.

According to the present disclosure, a bezel area can be minimized to improve an outer appearance quality.

According to the present disclosure, a flip over type liquid crystal display device which improves a reflection luminance by lowering a reflectance of the gate electrode can be provided.

According to the present disclosure, a liquid crystal display panel which reduces a number of processes while reducing reflectance can be provided.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
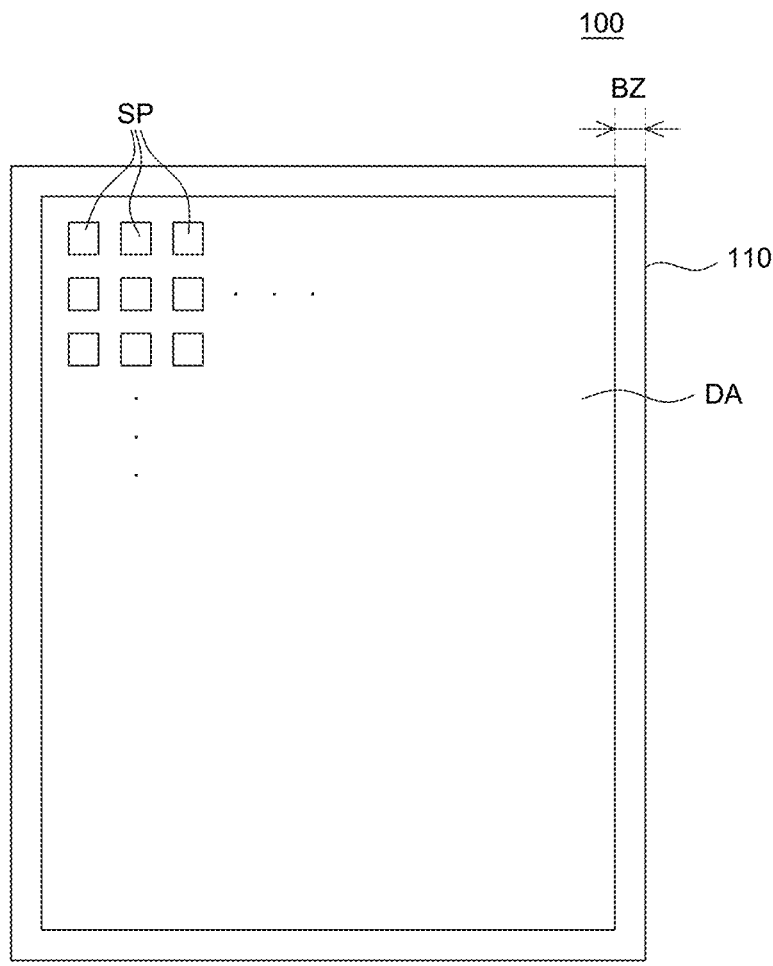
FIG. 1 is a schematic plan view of a liquid crystal display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a liquid crystal display device according to exemplary embodiments of the present disclosure will be described in detail with reference to accompanying drawings.

Figure 2:
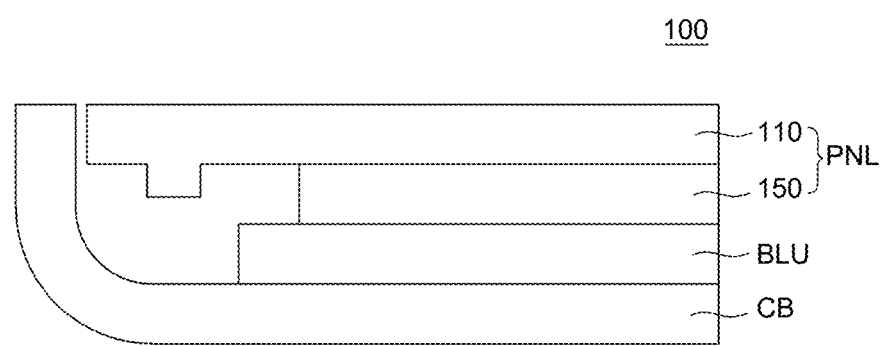
FIG. 2 is a schematic cross-sectional view of a liquid crystal display device according to an exemplary embodiment of the present disclosure.
Figure 3:
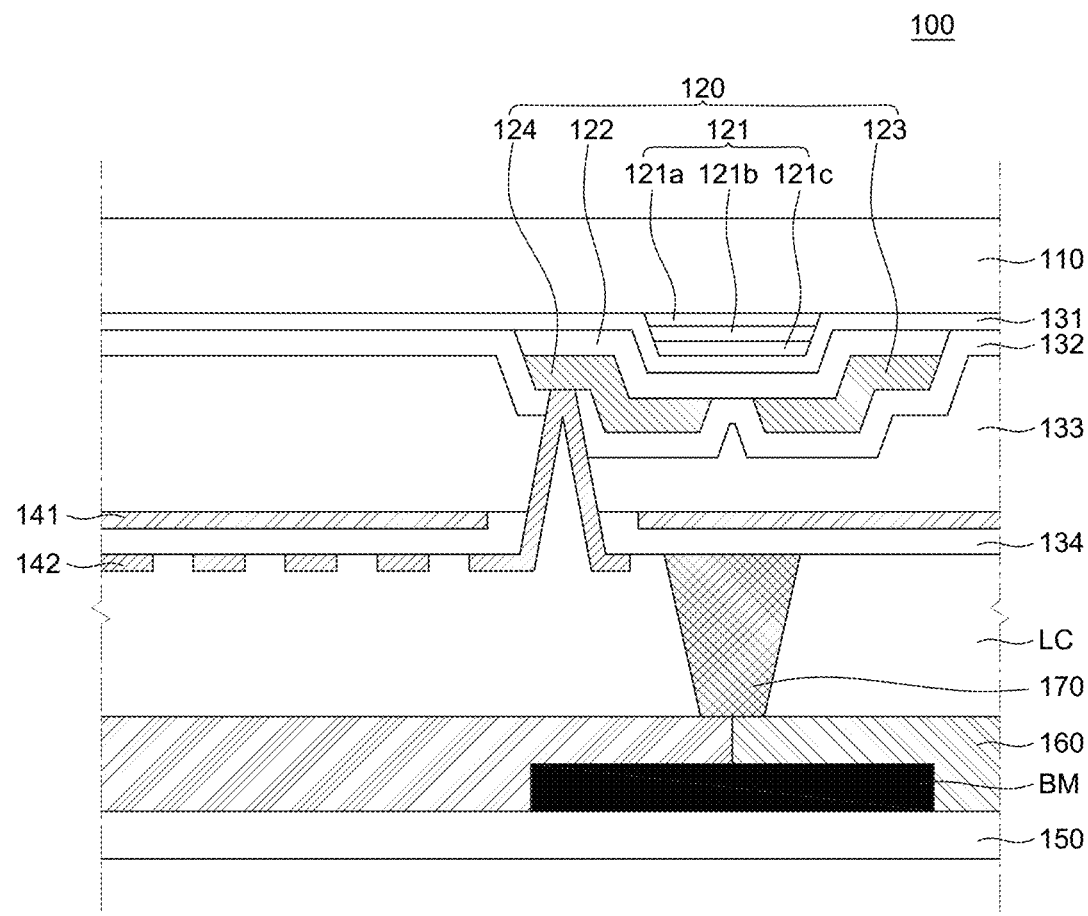
FIG. 3 is a schematic cross-sectional view for explaining a part of a liquid crystal display panel of a liquid crystal display device according to an exemplary embodiment of the present disclosure.

FIGS. 1 to 3 are views for explaining a liquid crystal display device according to an exemplary embodiment of the present disclosure.

FIG. 1 is a schematic plan view of a liquid crystal display device according to an exemplary embodiment of the present disclosure. In FIG. 1, for the convenience of description, among various components of the liquid crystal display device 100, only an upper substrate 110 and a plurality of sub pixels SP are illustrated.

The upper substrate 110 is a component for supporting various components included in the liquid crystal display device 100 and protecting the components from external shocks or external environments and may be formed of an insulating material. For example, the upper substrate 110 may be formed of a glass substrate or a plastic substrate such as polyethylene terephthalate (PET), polyethylene naphthalate (PEN), or polyimide.

Referring to FIG. 1, the upper substrate 110 supports various components of the liquid crystal display device 100. Referring to FIG. 1, the upper substrate 110 includes a display area DA and a bezel area BZ. The display area DA is an area in which a plurality of sub pixels SP is disposed, and images are actually displayed. The bezel area BZ is an outer peripheral area which encloses the display area DA in which images are not displayed. In the bezel area BZ, wiring lines and driving circuits for driving a screen are disposed.

The plurality of sub pixels SP may be defined on the upper substrate 110. The plurality of sub pixels is a minimum unit which configures the display area DA and each one is an area which displays one color. For example, the plurality of sub pixels may be configured by a red sub pixel, a green sub pixel, and a blue sub pixel. The plurality of sub pixels SP may be defined in the form of a matrix as illustrated in FIG. 1.

FIG. 2 is a schematic cross-sectional view of a liquid crystal display device according to an exemplary embodiment of the present disclosure. The liquid crystal display device 100 illustrated in FIG. 2 is a cross-sectional view illustrating a part of a structure of a borderless type liquid crystal display device 100.

Referring to FIG. 2, the liquid crystal display device according to the present disclosure includes a liquid crystal display panel PNL including an upper substrate 110 and a lower substrate 150, a backlight unit BLU, and a cover bottom CB.

The liquid crystal display panel PNL outputs images by disposing pixels in a matrix form and is configured by the upper substrate 110 and the lower substrate 150 which are bonded with a liquid crystal layer LC therebetween so as to control a light transmittance.

The liquid crystal display device 100 according to the exemplary embodiment of the present disclosure is a borderless type liquid crystal display device 100 and the upper substrate 110 is configured by an array substrate and the lower substrate 150 is configured by a color filter substrate. That is, unlike the related art, in the borderless type liquid crystal display device 100 according to the exemplary embodiment of the present disclosure, a liquid crystal display panel PNL is turned over so that an array substrate having a relatively larger area is located above the color filter substrate. Accordingly, the pad unit formed on the upper array substrate is disposed toward the rear surface of the liquid crystal display panel PNL so that a device such as an external cover (or a top case) for covering the pad unit may be removed and four-sided borderless type may be implemented. At this time, as described above, a structure in which the array substrate is located in an upper portion to be utilized as a viewing surface may be referred to as a flip-over type.

A specific structure of the liquid crystal display panel PNL will be described below with reference to FIG. 3.

The backlight unit BLU is disposed below the liquid crystal display panel PNL. The backlight unit BLU may include a light source, a reflective film, a light guide plate, a guide panel, and an optical film. At this time, the backlight unit BLU uses any one selected from a cold cathode fluorescence lamp (CCFL), a hot cathode fluorescence lamp (HCFL), an external electrode fluorescence lamp (EEFL), and a light emitting diode (LED) as a light source, but is not limited thereto.

The cover bottom CB is a case member which accommodates and protects a component of the liquid crystal display device 100. The cover bottom CB encloses side surfaces of the liquid crystal display panel PNL and the backlight unit BLU and may be disposed on the rear surface of the backlight unit BLU. Specifically, the cover bottom CB may be formed to have a rectangular frame whose edge is vertically bent. For example, the cover bottom CB may include a horizontal part disposed so as to be opposite to the rear surface of the backlight unit BLU and a vertical part extending from the horizontal part to enclose side surfaces of the liquid crystal display panel PNL and the backlight unit BLU.

The cover bottom CB may include a material having a high thermal conductivity and a high rigidity so as to smoothly emit heat from the driving circuit and the light source of the backlight unit BLU to the outside. For example, the cover bottom CB may be manufactured by a metal plate such as aluminum, aluminum nitride (AlN), electrolytic galvanized iron (EGI), stainless (SUS), galvalume (SGLC), aluminized steel sheet (a.k.a. ALCOSTA), and tin plated steel sheet (SPTE), but is not limited thereto.

Hereinafter, a liquid crystal display panel PNL of a liquid crystal display device 100 according to an exemplary embodiment of the present disclosure will be described with reference to FIG. 3. FIG. 3 is a schematic cross-sectional view for explaining a part of a liquid crystal display panel of a liquid crystal display device 100 according to an exemplary embodiment of the present disclosure.

FIG. 3 schematically illustrates a part of a fringe field switching (FFS) liquid crystal panel in which a fringe field formed between the pixel electrode 142 and the common electrode 141 passes through a slit to drive liquid crystal molecules located in the pixel area and on the common electrode 141 to implement an image. However, the present disclosure is not limited thereto, and may be also applied to an in-plane switching (IPS) liquid crystal display device 100 using a transverse electric field, as well as the FFS type.

Referring to FIG. 3, the liquid crystal display panel PNL includes a lower substrate 150 and an upper substrate 110. On the upper substrate 110, a thin film transistor 120, various wiring lines and electrodes are formed to define a plurality of sub pixels. On the lower substrate 150, a color filter which displays three primary colors of red, green, and blue and a black matrix BM which partitions each sub pixel may be formed. As illustrated in FIG. 2, an array substrate including the thin film transistor 120 having a relatively large area is located above the color filter substrate to implement a borderless liquid crystal display device 100.

On the upper substrate 110, a plurality gate lines and a plurality of data lines which are horizontally and vertically disposed to define a plurality of pixel areas, thin film transistors 120 formed in intersecting areas of the gate line and the data line, and a pixel electrode 142 disposed in the pixel area may be formed.

The thin film transistor 120 is disposed on the upper substrate 110. The thin film transistor 120 may be used as a driving element of the liquid crystal display device 100. The thin film transistor 120 includes a gate electrode 121, an active layer 122, a source electrode 123, and a drain electrode 124. In the liquid crystal display device 100 according to the exemplary embodiment of the present disclosure, the thin film transistor 120 has a structure in which the active layer 122 is disposed on the gate electrode 121 and the source electrode 123 and the drain electrode 124 are disposed on the active layer 122. Therefore, the thin film transistor 120 has a bottom gate structure in which the gate electrode 121 is disposed in the lowermost portion, but is not limited thereto. Alternatively, the transistor may be a top gate type thin film transistor 120 in which the gate electrode 121 is disposed above the active layer 122.

A buffer layer may be disposed between the upper substrate 110 and the thin film transistor 120. The buffer layer may be formed on the upper substrate 110 to protect various components of the liquid crystal display device 100 from permeation of moisture (H2O) and hydrogen (H2) from the outside of the upper substrate 110. The buffer layer may be configured by an insulating material and for example, configured by a single layer or a double layer of an inorganic layer formed of silicon nitride (SiNx), silicon oxide (SiOx), and silicon oxynitride (SiON). However, the buffer layer may be omitted depending on a structure or a characteristic of the liquid crystal display device 100.

The gate electrode 121 of the thin film transistor 120 extends from the gate line. The gate electrode 121 may be formed of a plurality of layers, and for example, may be formed of triple layers. Specifically, the gate electrode 121 may include a first gate conductive layer 121a, a second gate conductive layer 121b, and a third gate conductive layer 121c. The first gate conductive layer 121a, the second gate conductive layer 121b, and the third gate conductive layer 121c may sequentially be laminated on the upper substrate 110.

The first gate conductive layer 121a may be formed of a transparent conductive material. For example, the transparent conductive material may be formed of tin oxide (TO), indium tin oxide (ITO), indium zinc oxide (IZO), or indium zinc tin oxide (ITZO), but is not limited thereto.

The third gate conductive layer 121c may be formed of an opaque conductive material. For example, the opaque conductive material may be formed of copper (Cu), molybdenum (Mo), aluminum (Al), chrome (Cr), gold (Au), titanium (Ti), nickel (Ni), neodymium (Nd), or an alloy thereof, but is not limited thereto.

The second gate conductive layer 121b is disposed between the first gate conductive layer 121a and the third gate conductive layer 121c to reduce a reflectance of the gate electrode 121. The second gate conductive layer 121b has a low reflection characteristic. The second gate conductive layer 121b may be formed of a low reflective conductive material.

As a first exemplary embodiment, the second gate conductive layer 121b includes a first transition metal oxide and a second transition metal oxide.

The first transition metal oxide may be oxide including one or more selected from a group consisting of copper (Cu), molybdenum (Mo), chrome (Cr), titanium (Ti), and nickel (Ni). For example, when the transition metal oxide which configures the second gate conductive layer 121b is molybdenum, the first transition metal oxide may be MoO2, MoO3, or a combination thereof.

The second transition metal oxide is oxide containing at least one selected from the group consisting of molybdenum (Mo), scandium (Sc), titanium (Ti), vanadium (V), chromium (Cr), manganese (Mn), iron (Fe), cobalt (Co), nickel (Ni), copper (Cu), zinc (Zn), zirconium (Zr), niobium (Nb), technetium (Tc), ruthenium (Ru), rhodium (Rh), cadmium (Cd), tantalum (Ta), tungsten (W), rhenium (Re), platinum (Pt), iridium (Ir), hafnium (Hf) and palladium (Pd). The second transition metal oxide may be desirably oxide of niobium (Nb), tungsten (W), titanium (Ti), zirconium (Zr), or hafnium (Hf). For example, the second transition metal oxide may include one or more selected from a group consisting of MoO2, MoO3, TiO2, V2O5, Cr2O3, CrO3, CrO, CrO2, MnO, FeO, Fe2O3, Fe3O4, CoO, Co3O4, NiO, CuO, Cu2O, ZnO, ZrO2, Nb2O5, CeO2, Au2O, Ag2O, PtO, PdO, and WO3, but is not limited thereto.

At this time, the second transition metal oxide may be formed of a material different from that of the above-described first transition metal oxide. For example, when the first transition metal oxide which configures the second gate conductive layer 121b is molybdenum oxide (MoO2 or MoO3), the second transition metal oxide may be oxide formed of a different transition metal material excluding MoO2 or MoO3. For example, the second transition metal oxide may be Nb2O5, but is not limited thereto.

In the meantime, the first transition metal oxide may be included at 70 wt % to 80 wt % based on the entire material which configures the second gate conductive layer 121b, that is, a sum of the first transition metal oxide and the second transition metal oxide. Further, the second transition metal oxide may be included at 20 wt % to 30 wt % based on the entire material which configures the second gate conductive layer 121b. When a content of the first transition metal oxide and the second transition metal oxide which configure the second gate conductive layer 121b satisfies the above-mentioned range, the second gate conductive layer 121b serves as a low reflective layer between the first gate conductive layer 121a and the third gate conductive layer 121c, and may reduce the entire reflectance of the gate electrode 121. Accordingly, a reflection luminance of the liquid crystal display panel PNL may be improved.

As a second exemplary embodiment, the second gate conductive layer 121b may include a transition metal material, a first transition metal oxide, and a second transition metal oxide.

At this time, the transition metal material may be formed of copper (Cu), molybdenum (Mo), chrome (Cr), titanium (Ti), nickel (Ni), or an alloy thereof, and desirably, may be copper (Cu), molybdenum (Mo), or nickel (Ni).

The first transition metal oxide is the same as the first transition metal oxide used in the first exemplary embodiment. However, the first transition metal oxide includes oxide of a material selected from the above-mentioned transition metal materials. That is, when the transition metal oxide which configures the second gate conductive layer 121b is molybdenum, the first transition metal oxide may be MoO2, MoO3, or a combination thereof.

Oxide of the second transition metal oxide is the same as the second transition metal oxide used in the first exemplary embodiment. However, the second transition metal oxide includes oxide of a transition metal material different from the material selected from the above-mentioned transition metal materials. That is, when the transition metal oxide which configures the second gate conductive layer 121b is molybdenum, the second transition metal oxide may be oxide of different transition metal material excluding MoO2 and MoO3. For example, the second transition metal oxide may be Nb2O5, but is not limited thereto.

In the second exemplary embodiment, the transition metal material may be included with 3 wt % to 9 wt % based on the entire material which configures the second gate conductive layer 121b, that is, a sum of the first transition metal oxide and the second transition metal oxide. Further, the first transition metal oxide may be included at 55 wt % to 77 wt % based on the entire material which configures the second gate conductive layer 121b. Further, the second transition metal oxide may be included at 20 wt % to 30 wt % based on the entire material which configures the second gate conductive layer 121b.

The gate electrode 121 adjusts a reflectance and a light transmittance by adjusting thicknesses of the first gate conductive layer 121a, the second gate conductive layer 121b, and the third gate conductive layer 121c. For example, the thickness of the first gate conductive layer 121a may be 30 nm to 60 nm and the thickness of the third gate conductive layer 121c may be 100 nm to 500 nm, but are not limited thereto. Further, the thickness of the second gate conductive layer 121b may be 20 nm to 70 nm, or 40 nm to 60 nm. The thicknesses of the first gate conductive layer 121a, the second gate conductive layer 121b, and the third gate conductive layer 121c may be adjusted to thicknesses which may implement a low reflectance and a high light transmittance by considering reflective indexes of materials which configure each of the conductive layers.

A reflectance of the gate electrode 121 may be 20% or lower, and desirably, may be 10% or lower. Further, when an upper polarizer is applied, a reflectance of the entire liquid crystal display device 100 may be 10% or lower, and desirably, may be 6% or lower.

The gate insulating layer 131 is disposed on the gate electrode 121. The gate insulating layer 131 is a layer for insulating the gate electrode 121 from the active layer 122 and may be formed of an insulating material. For example, the gate insulating layer 131 may be configured by a single layer or a double layer of silicon oxide SiOx or silicon nitride SiNx, but is not limited thereto.

The active layer 122 is disposed on the gate insulating layer 131. The active layer 122 is disposed so as to overlap the gate electrode 121. For example, the active layer 122 may be formed of amorphous silicon, polycrystalline silicon, an oxide semiconductor, or an organic semiconductor, but is not limited thereto.

The data line, the source electrode 123, and the drain electrode 124 are disposed on the active layer 122. The source electrode 123 and the drain electrode 124 are disposed on the same layer to be spaced apart from each other. The source electrode 123 and the drain electrode 124 may be in contact with the active layer 122 to be electrically connected to the active layer 122. The source electrode 123 extends from the data line.

A passivation layer 132 is disposed on the source electrode 123 and the drain electrode 124. The passivation layer 132 is an insulating layer for protecting components below the passivation layer 132. The passivation layer 132 may be configured by a single layer or a double layer of silicon oxide SiOx or silicon nitride SiNx, but is not limited thereto.

A planarization layer 133 is disposed on the passivation layer 132. The planarization layer 133 is an insulating layer which planarizes an upper portion of the upper substrate 110.

The planarization layer 133 may be formed of an organic material, and for example, may be configured by a single layer or a double layer of polyimide or photo acryl, but is not limited thereto. The planarization layer 133 may include a contact hole which electrically connects the thin film transistor 120 and the pixel electrode 142.

A common electrode 141 is formed on the planarization layer 133. The common electrode 141 is electrically connected to a common line. The common electrode 141 is configured as one large electrode and is commonly used for sub pixels SP. In some exemplary embodiments, the common electrode 141 may be configured by a plurality of common electrode blocks. In this case, the common electrode blocks may function as touch electrodes of capacitive type touch electrodes and the liquid crystal display device 100 may be implemented as a display device embedded with a touch element.

The common electrode 141 may be formed of a transparent conductive material. For example, the transparent conductive material may be formed of tin oxide (TO), indium tin oxide (ITO), indium zinc oxide (IZO), or indium zinc tin oxide (ITZO), but is not limited thereto.

A protective layer 134 is disposed on the common electrode 141. The protective layer 134 is a layer for insulating the common electrode 141 from the pixel electrode 142 and may be formed of an inorganic insulating material or an organic insulating material. For example, the protective layer 134 may be configured by a single layer or a double layer of silicon oxide SiOx or silicon nitride SiNx, but is not limited thereto.

The pixel electrode 142 is disposed on the protective layer 134. The pixel electrode 142 is electrically connected to the drain electrode 124 through contact holes which pass through the protective layer 134, the planarization layer 133, and the passivation layer 132 therebelow. Even though in FIG. 3, the pixel electrode 142 which is in contact with the drain electrode 124 of the thin film transistor 120 is illustrated, in some exemplary embodiments, the pixel electrode 142 may be in contact with the source electrode of the thin film transistor 120.

The pixel electrode 142 may be formed with a structure having a plurality of slits. In this case, the pixel electrode 142 may have a straight shape or a zigzag pattern having one or more curved portions. Even though in FIG. 3, in the liquid crystal display device 100, a structure in which the pixel electrode 142 has a plurality of slits and the common electrode 141 is formed of a single electrode block is illustrated, it is not limited thereto. Therefore, the pixel electrode 142 is formed of a single electrode block and the common electrode 141 has a plurality of slits.

The pixel electrode 142 is spaced apart from the common electrode 141 with the protective layer 134 therebetween. When a voltage is applied to the pixel electrode 142 by means of the thin film transistor 120, a fringe field is formed between the pixel electrode 142 and the common electrode 141 which are spaced apart from each other. In this case, liquid crystals located on the pixel electrode 142 and the common electrode 141 rotate by dielectric anisotropy and transmittance of light which transmits the display area varies depending on the degree of rotation of liquid crystals, so that a light quantity of the sub pixel SP may be controlled.

A black matrix BM, a color filter layer 160, and a spacer 170 are disposed on the lower substrate 150 which is opposite to the upper substrate 110.

The lower substrate 150 is a component for supporting various components included in the liquid crystal display device 100 and may be formed of an insulating material. For example, the lower substrate 150 may be formed of a glass substrate or a plastic substrate such as polyethylene terephthalate (PET), polyethylene naphthalate (PEN), or polyimide.

The black matrix BM is disposed on the lower substrate 150 so as to overlap the thin film transistor 120, the gate line, and the data line of the upper substrate 110. The black matrix BM may be formed of an opaque organic material, and for example, may include black resin. The black matrix BM may have a straight shape or a zigzag pattern having one or more curved portions. The thin film transistor 120, the gate line, and the data line may be covered by the black matrix BM and an area in which the black matrix BM is not disposed is an opening area and corresponds to an area through which light of the sub pixel SP transmits.

The color filter layer 160 is disposed on the black matrix BM. The color filter layer 160 includes a plurality of color filters which transmits light having different wavelengths each other. The color filters may be configured by red, green, and blue color filters including red, green, and blue pigments. Light having a specific wavelength is absorbed or transmitted using the color filters to express red, green, and blue. The color filters are formed with a straight shape or a zigzag pattern having at least one or more curved portions. In some exemplary embodiments, the positions of the black matrix BM and the color filter layer 160 may be switched.

The spacer 170 for maintaining a gap between the lower substrate 150 and the upper substrate 110 is disposed between the lower substrate 150 and the upper substrate 110.

A liquid crystal layer LC is disposed in the gap between the lower substrate 150 and the upper substrate 110 formed by the spacer 170. The liquid crystal layer LC is a layer including liquid crystals to transmit or block light by the electric field. Specifically, the liquid crystal layer LC changes a light transmittance by an electric field generated by the common electrode 141 and the pixel electrode 142 to display images.

The liquid crystal display device 100 according to the exemplary embodiment of the present disclosure uses the gate electrode 121 configured by a plurality of layers including the gate electrode 121 configured by two types of transition metal oxides (first exemplary embodiment) or a transition metal material (second exemplary embodiment) together with two types of transition metal oxides. Specifically, the liquid crystal display device has a structure in which the first gate conductive layer 121a, the second gate conductive layer 121b, and the third gate conductive layer 121c are sequentially laminated. The first gate conductive layer 121a is disposed on a lower surface of the upper substrate 110 and is formed of a transparent conductive material. The second gate conductive layer 121b is disposed on the lower surface of the first gate conductive layer 121a and includes the first transition metal oxide and the second transition metal oxide. The third gate conductive layer 121c is disposed on the lower surface of the second gate conductive layer 121b and is formed of an opaque conductive material. This structure may significantly reduce the reflectance for external light. Further, the second gate conductive layer 121b which serves as a low reflective layer is disposed between the first gate conductive layer 121a formed of a transparent conductive layer such as ITO and the third gate conductive layer 121c formed of an opaque conductive layer such as Cu. By doing this, in the flip-over type liquid crystal display device 100, the degradation of a black luminance due to an inherent color of copper (Cu) may be suppressed.

Figure 4:
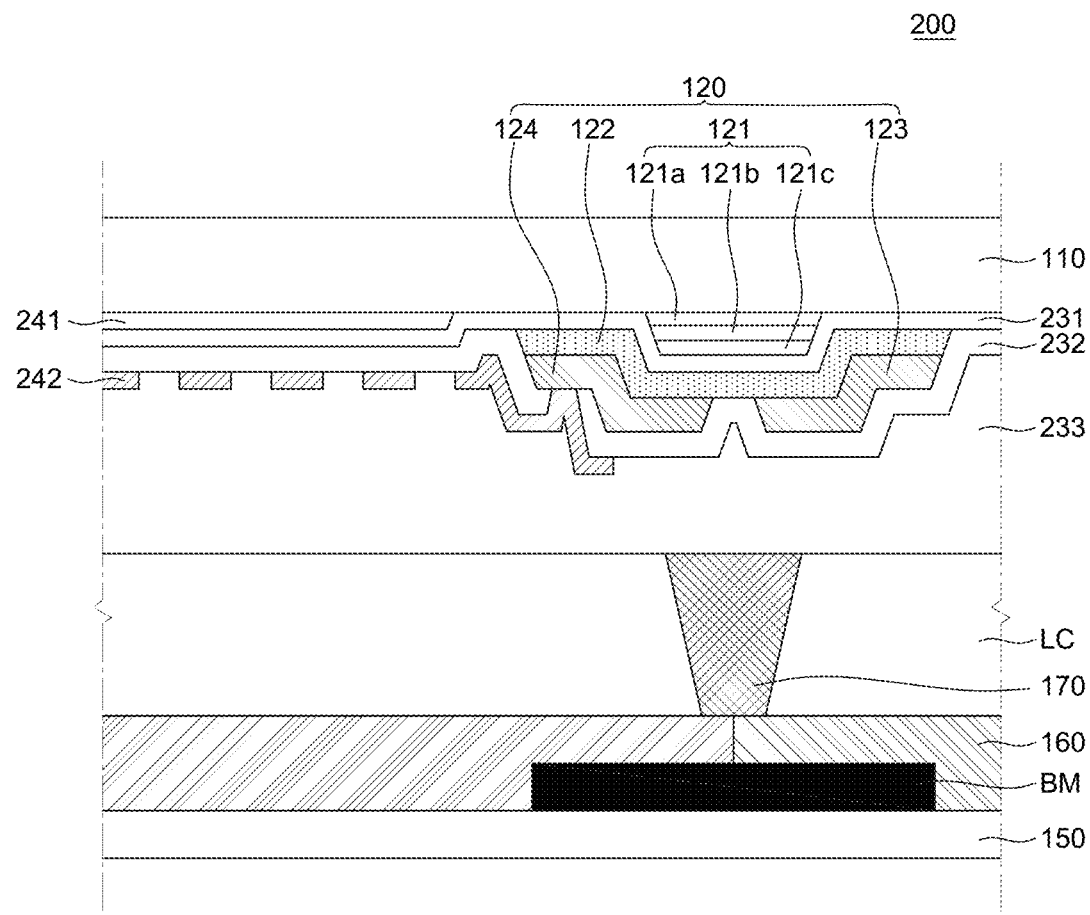
FIG. 4 is a schematic cross-sectional view for explaining a part of a liquid crystal display panel of a liquid crystal display device according to another exemplary embodiment of the present disclosure.

FIG. 4 is a schematic cross-sectional view for explaining a part of a liquid crystal display panel PNL of a liquid crystal display device according to another exemplary embodiment of the present disclosure. A liquid crystal display device 200 illustrated in FIG. 4 is substantially the same as the liquid crystal display device 100 illustrated in FIG. 3 except for a configuration for a common electrode 241 and a pixel electrode 242 so that a redundant description will be omitted.

Referring to FIG. 4, the common electrode 241 is formed on the substrate and is formed on the same layer as the gate electrode 121. The common electrode 241 is disposed to correspond to the pixel area so as not to overlap the thin film transistor 120. In some exemplary embodiments, the common electrode 241 may be configured by a plurality of common electrode blocks.

The common electrode 241 may be formed of the same material as the first gate conductive layer 121*a* of the gate electrode 121. That is, the common electrode 241 may be formed of the same transparent conductive material, like the first gate conductive layer 121*a*. For example, the transparent conductive material may be formed of tin oxide (TO), indium tin oxide (ITO), indium zinc oxide (IZO), or indium zinc tin oxide (ITZO), but is not limited thereto.

The common electrode 241 may be formed together by the same process as the first gate conductive layer 121*a*. In this case, as compared with the liquid crystal display device 100 illustrated in FIG. 3 in which the common electrode 141 is disposed on the planarization layer 133, it is advantageous in that a separate process for forming the common electrode 241 may be excluded.

The pixel electrode 242 is formed on the passivation layer 232. The pixel electrode 242 is electrically connected to the drain electrode 124 through a contact hole which passes through the passivation layer 232. The pixel electrode 242 is spaced apart from the common electrode 241 with the gate insulating layer 231 and the passivation layer 232 therebetween. When a voltage is applied to the pixel electrode 242 by means of the thin film transistor 120, a fringe field is formed between the pixel electrode 242 and the common electrode 241 which are spaced apart from each other. Therefore, the liquid crystals are rotated by forming the fringe field and a light quantity of the sub pixel SP may be controlled.

In the liquid crystal display device 100 illustrated in FIG. 3, a separate protective layer 134 is disposed between the pixel electrode 142 and the common electrode 141. However, in the liquid crystal display device 200 according to another exemplary embodiment of the present disclosure, the pixel electrode 242 is formed on the passivation layer 232 so that a separate process for forming a protective layer may be omitted.

In the liquid crystal display device according to another exemplary embodiment of the present disclosure, the common electrode is disposed on the substrate to be disposed on the same layer as the first gate conductive layer which configures the gate electrode and is formed by the same process. Further, as the common electrode is located as the same layer as the gate electrode, the pixel electrode may be disposed on the passivation layer. According to the structural characteristic, the common electrode is formed by the same process as the first gate conductive layer so that a step for forming a separate common electrode may be omitted and further, a step for forming a protective layer formed to insulate the common electrode from the pixel electrode may also be omitted. By doing this, a total number of steps for forming the liquid crystal display device may be reduced.

Hereinafter, the effects of the present disclosure will be described in more detail with reference to Examples and Comparative Examples. However, the following Examples are set forth to illustrate the present disclosure, and the scope of the disclosure is not limited thereto.

Example 1

On a substrate, a gate electrode in which a 50 nm-first gate conductive layer formed of ITO, a 50 nm-second gate conductive layer formed of 60 wt % of $MoO_2$, 15 wt % of $MoO_3$, and 25 wt % of $Nb_2O_5$, and a 300 nm-third gate conductive layer formed of Cu were sequentially laminated was formed.

Example 2

On a substrate, a gate electrode in which a 50 nm-first gate conductive layer formed of ITO, a 50 nm-second gate conductive layer formed of 5 wt % of molybdenum metal, 60 wt % of $MoO_2$, 10 wt % of $MoO_3$, and 25 wt % of $Nb_2O_5$, and a 300 nm-third gate conductive layer formed of Cu were sequentially laminated was formed.

Comparative Example 1

On a glass substrate, a gate electrode in which a 50 nm-first metal layer formed of ITO, a 10-nm second metal layer formed of copper (Cu), a 30 nm-third metal layer formed of a molybdenum-titanium (MoTi) alloy, and a 300 nm-fourth metal layer formed of copper (Cu) were sequentially laminated was formed.

Experimental Example 1

A reflectance toward a substrate surface for manufactured gate electrodes of Examples 1 and 2, and Comparative Example 1 was measured using CM2600d (Konica Minolta, Inc.). A measurement result was illustrated in FIG. 5A. Further, after disposing a polarizing film on an opposite surface of the glass substrate on which the gate electrode was formed, a reflectance was measured toward a direction in which the polarizing film was disposed. A measurement result was illustrated in FIG. 5B.

Figure 5A:
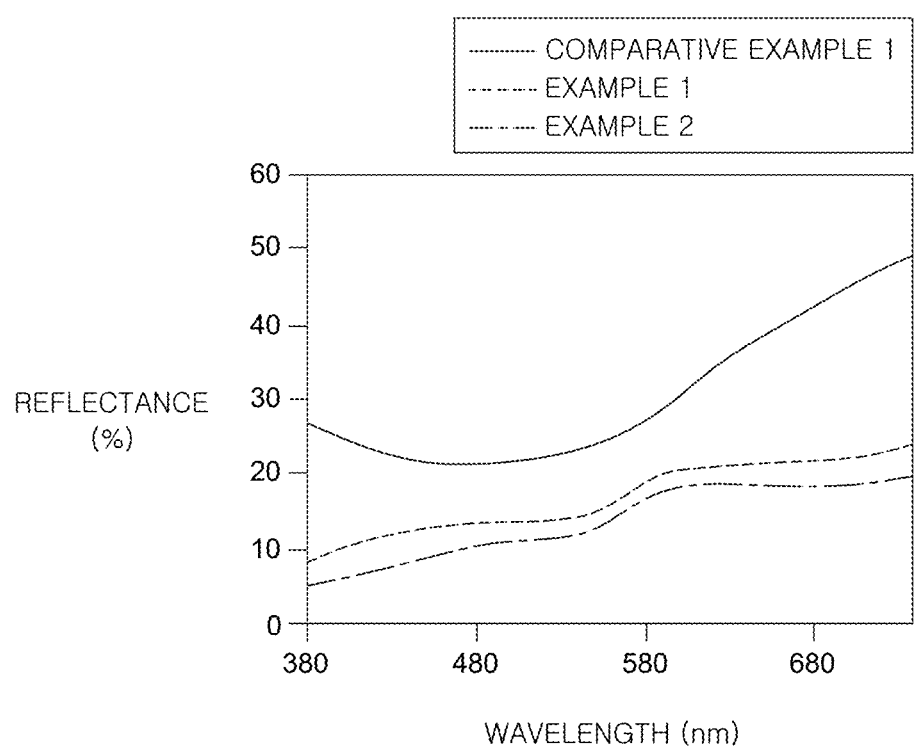
FIGS. 5A and 5B are graphs of measuring a reflectance for a gate electrode manufactured by Examples 1 and 2, and Comparative Example 1.
Figure 5B:
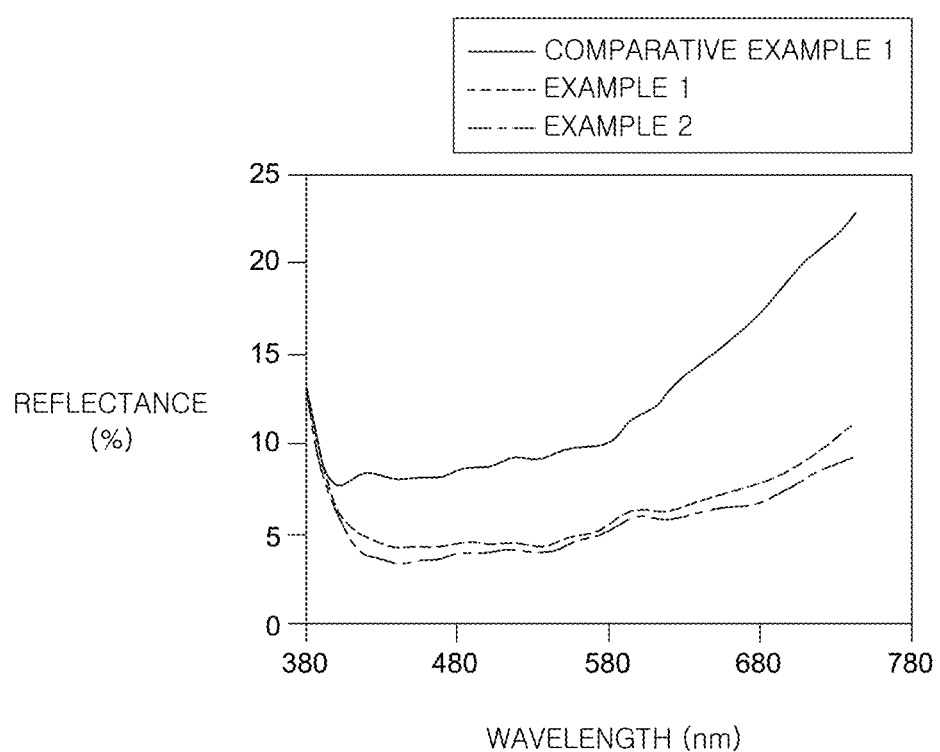

Referring to FIG. 5A, it was confirmed that a reflectance of a structure of Examples 1 and 2 in which a low reflective layer formed of molybdenum, a molybdenum oxide, and a niobium oxide was disposed between ITO and Cu was significantly lower than reflectance of a quadruple-layered structure of ITO/Cu/MoTi/Cu which was used as a gate electrode in the related art. Further, referring to FIG. 5B, it was confirmed that when a polarizing film was disposed on an opposite surface of a surface on which the gate electrode was disposed to improve the reflection time, the entire transmittance was significantly improved. Specifically, in Examples 1 and 2, it was confirmed that a reflectance in a wavelength band of 400 nm to 550 nm was 15% or lower and when the polarizing film was applied, the reflectance was 6% or lower.

Comparative Example 2

On a substrate, a gate electrode in which a 50 nm-first gate conductive layer formed of ITO, a 50 nm-second gate conductive layer formed of a molybdenum metal (Mo), and a 300 nm-third gate conductive layer formed of copper (Cu) were sequentially laminated was formed.

Comparative Example 3

On a substrate, a gate electrode in which a 50 nm-first gate conductive layer formed of 5 wt % of molybdenum metal, 60 wt % of MoO2, 10 wt % of MoO3, and 25 wt % of Nb2O5, a 50 nm-second gate conductive layer formed of ITO, and a 300 nm-third gate conductive layer formed of copper (Cu) were sequentially laminated was formed.

Experimental Example 2

A reflectance toward a substrate surface for manufactured gate electrodes of Example 2, and Comparative Examples 2 and 3 was measured using CM2600d (Konica Minolta, Inc.). A measurement result was illustrated in FIG. 6.

Figure 6:
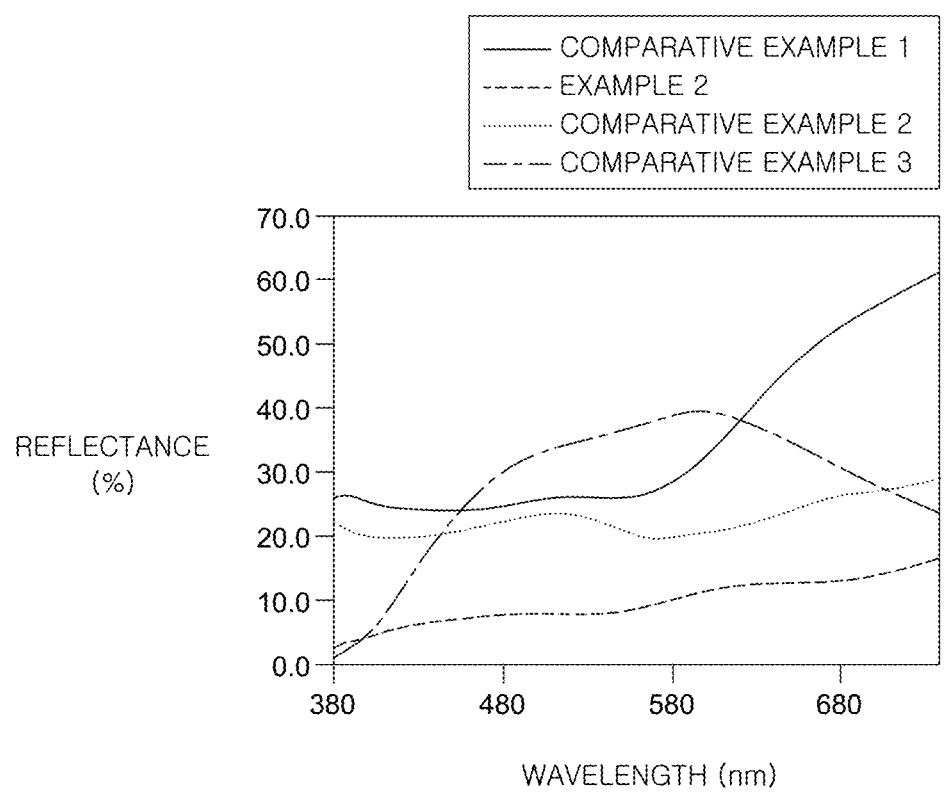
FIG. 6 is a graph of measuring reflectance for a gate electrode manufactured by Example 1 and Comparative Examples 1 to 3.

Referring to FIG. 6, unlike Example 2 in which a low reflective layer formed of molybdenum, a molybdenum oxide, and a niobium oxide was disposed between ITO and Cu, it was confirmed that in Comparative Example 2 in which the second metal layer was formed of only molybdenum, the overall reflectance was reduced as compared to Comparative Example 1. However, the reflectance was higher than that of Example 2. Further, unlike Example 2 in which the low reflective layer was disposed between ITO and Cu, in Comparative Example 3 in which the low reflective layer/ITO/Cu were laminated in this order, it was confirmed that reflectance was significantly higher than that of Example 2.

Experimental Example 3

In manufactured Example 1, the reflectance was measured by changing the thickness of the second gate conductive layer which was formed of molybdenum, molybdenum oxide, and niobium oxide. A measurement result was illustrated in FIG. 7.

Figure 7:
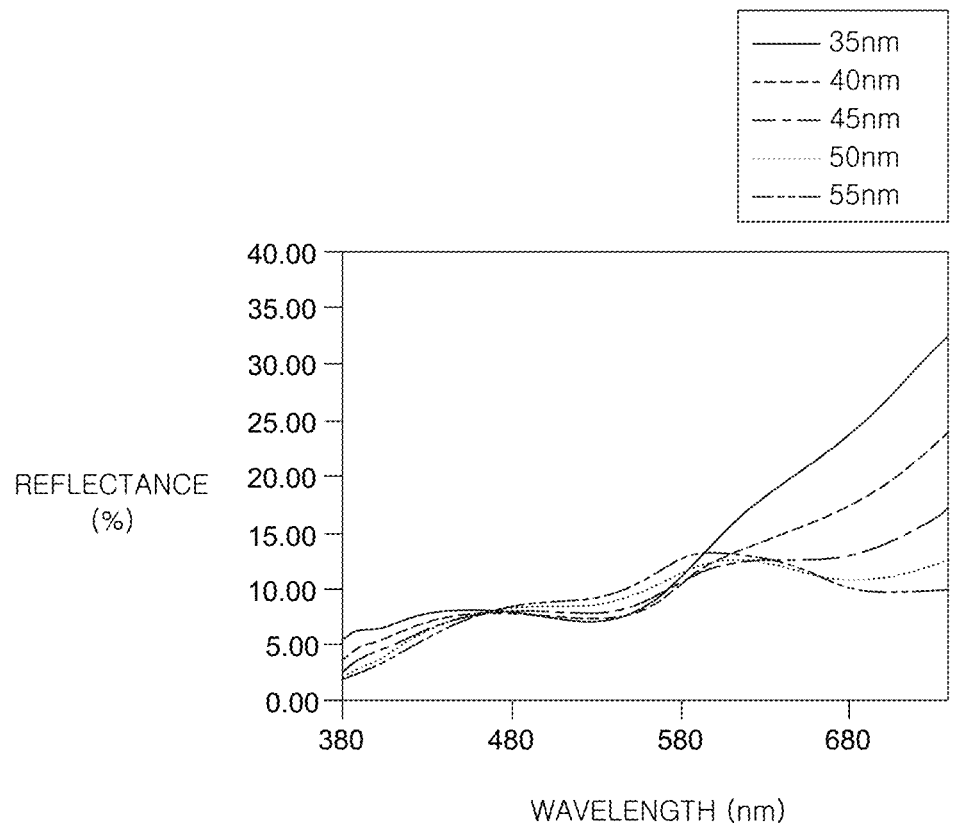
FIG. 7 is a graph measuring a reflectance for a gate electrode formed by varying a thickness of a second gate conductive layer.

Referring to FIG. 7, it was confirmed that when the thickness of the second gate conductive layer was 40 nm to 55 nm, the effect of reducing the reflectance was excellent.

The exemplary embodiments of the present disclosure can also be described as follows:

According to an aspect of the present disclosure, there is provided a liquid crystal display device. The liquid crystal display device comprises a lower substrate including a black matrix and a color filter; an upper substrate disposed to be opposite to the lower substrate; a thin film transistor disposed on the upper substrate to be opposite to the color filter, and includes a gate electrode, an active layer, a source electrode, and a drain electrode; at least one insulting layer disposed on the thin film transistor; a pixel electrode disposed on the insulating layer and is electrically connected to the drain electrode; and a common electrode spaced apart from the pixel electrode. The gate electrode includes a first gate conductive layer including a transparent conductive material, a second gate conductive layer including a first transition metal oxide and a second transition metal oxide, and a third gate conductive layer formed of an opaque conductive layer.

The upper substrate may have a larger area than that of the lower substrate.

The second gate conductive layer further may include a transition metal material, and the transition metal material is formed of copper (Cu), molybdenum (Mo), chrome (Cr), titanium (Ti), nickel (Ni), or an alloy thereof.

The first transition metal oxide may be an oxide of the transition metal material and the second transition metal oxide may be an oxide of a transition metal material which is different from the transition metal material.

The first transition metal oxide may be an oxide including one or more selected from a group consisting of copper (Cu), molybdenum (Mo), chrome (Cr), titanium (Ti), and nickel (Ni), and the second transition metal oxide may be an oxide including one or more selected from a group consisting of niobium (Nb), tungsten (W), titanium (Ti), zirconium (Zr), and hafnium (Hf).

The second gate conductive layer may be formed of molybdenum (Mo), MoO2, MoO3, and Nb2O5.

The first gate conductive layer may include one or more selected from a group consisting of tin oxide (TO), indium tin oxide (ITO), indium zinc oxide (IZO), and indium zinc tin oxide (ITZO), and the third gate conductive layer includes copper.

The second gate conductive layer may include 70 wt % to 80 wt % of the first transition metal oxide; and 20 wt % to 30 wt % of the second transition metal oxide.

The second gate conductive layer may include 3 wt % to 9 wt % of the transition metal material; 55 wt % to 77 wt % of the first transition metal oxide; and 20 wt % to 30 wt % of the second transition metal oxide.

A thickness of the first gate conductive layer may be 30 nm to 60 nm; a thickness of the second gate conductive layer may be 40 nm to 60 nm; and a thickness of the third gate conductive layer may be 100 nm to 500 nm.

The at least one insulating layer may include a passivation layer disposed on the thin film transistor, a planarization layer disposed on the passivation layer, and a protective layer disposed on the planarization layer, and the common electrode may be disposed on the planarization layer and the pixel electrode is disposed on the protective layer.

The common electrode may be formed on the same layer as the gate electrode and may be formed of the same material as the first gate conductive layer.

The at least one insulating layer may include a passivation layer disposed on the thin film transistor and a planarization layer disposed on the passivation layer, and the pixel electrode may be disposed on the passivation layer.

It will be apparent to those skilled in the art that various modifications and variations can be made in the liquid crystal display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A liquid crystal display device, comprising:
    a backlight unit;
    a lower substrate disposed on the backlight unit and including a black matrix and a color filter;
    an upper substrate disposed on the lower substrate to be opposite to the lower substrate;
    a thin film transistor disposed on the upper substrate to be opposite to the color filter, and including a gate electrode, an active layer, a source electrode, and a drain electrode;
    at least one insulting layer disposed on the thin film transistor;
    a pixel electrode disposed on the insulating layer and electrically connected to the drain electrode; and
    a common electrode spaced apart from the pixel electrode,
    wherein the gate electrode includes a first gate conductive layer including a transparent conductive material, a second gate conductive layer including a first transition metal oxide and a second transition metal oxide, and a third gate conductive layer formed of an opaque conductive layer, and
    wherein the first gate conductive layer, the second gate conductive layer, and the third gate conductive layer are sequentially laminated on the upper substrate so that the second gate conductive layer is between the first gate conductive layer and the third gate conductive layer.

2. The liquid crystal display device according to claim 1, wherein the upper substrate has a larger area than the lower substrate.

3. The liquid crystal display device according to claim 1, wherein the second gate conductive layer further includes a transition metal material, and the transition metal material is formed of copper (Cu), molybdenum (Mo), chrome (Cr), titanium (Ti), nickel (Ni), or an alloy thereof.

4. The liquid crystal display device according to claim 3, wherein the first transition metal oxide is an oxide of the transition metal material and the second transition metal oxide is an oxide of a transition metal material which is different from the transition metal material.

5. The liquid crystal display device according to claim 4, wherein the first transition metal oxide is an oxide including one or more selected from a group consisting of copper (Cu), molybdenum (Mo), chrome (Cr), titanium (Ti), and nickel (Ni), and the second transition metal oxide is an oxide including one or more selected from a group consisting of niobium (Nb), tungsten (W), titanium (Ti), zirconium (Zr), and hafnium (Hf).

6. The liquid crystal display device according to claim 5, wherein the second gate conductive layer is formed of molybdenum (Mo), $MoO_2$, $MoO_3$, and $Nb_2O_5$.

7. The liquid crystal display device according to claim 3, wherein the second gate conductive layer includes:
  3 wt % to 9 wt % of the transition metal material;
  55 wt % to 77 wt % of the first transition metal oxide; and
  20 wt % to 30 wt % of the second transition metal oxide.

8. The liquid crystal display device according to claim 1, wherein the first gate conductive layer includes one or more selected from a group consisting of tin oxide (TO), indium tin oxide (ITO), indium zinc oxide (IZO), and indium zinc tin oxide (ITZO), and the third gate conductive layer includes one or more selected from a group consisting of copper (Cu), molybdenum (Mo), aluminum (Al), chrome (Cr), gold (Au), titanium (Ti), nickel (Ni), neodymium (Nd), or an alloy thereof.

9. The liquid crystal display device according to claim 8, wherein the third gate conductive layer includes copper (Cu).

10. The liquid crystal display device according to claim 1, wherein the second gate conductive layer includes:
  70 wt % to 80 wt % of the first transition metal oxide; and
  20 wt % to 30 wt % of the second transition metal oxide.

11. The liquid crystal display device according to claim 1, wherein a thickness of the first gate conductive layer is 30 nm to 60 nm; a thickness of the second gate conductive layer is 40 nm to 60 nm; and a thickness of the third gate conductive layer is 100 nm to 500 nm.

12. The liquid crystal display device according to claim 1, wherein the at least one insulating layer includes:
  a passivation layer disposed on the thin film transistor, a planarization layer disposed on the passivation layer, and a protective layer disposed on the planarization layer, and
  the common electrode is disposed on the planarization layer and the pixel electrode is disposed on the protective layer.

13. The liquid crystal display device according to claim 1, wherein the common electrode is formed on the same layer as the gate electrode and is formed of the same material as the first gate conductive layer.

14. The liquid crystal display device according to claim 13, wherein the at least one insulating layer includes a passivation layer disposed on the thin film transistor and a planarization layer disposed on the passivation layer, and
  the pixel electrode is disposed on the passivation layer.

15. The liquid crystal display device of claim 1, wherein:
  the first gate conductive layer, the second gate conductive layer, and the third gate conductive layer are sequentially laminated on a surface of the upper substrate facing the lower substrate; and
  the first gate conductive layer is disposed closest to the upper substrate among the first, second, and third gate conductive layers.

16. The liquid crystal display device of claim 15, wherein the upper substrate is configured as a viewing surface of the liquid crystal display device.

* * * * *